US007255601B2

(12) United States Patent
Harper, Jr.

(10) Patent No.: US 7,255,601 B2
(45) Date of Patent: Aug. 14, 2007

(54) CAP FOR AN ELECTRICAL CONNECTOR

(75) Inventor: Donald K. Harper, Jr., Camp Hill, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 11/019,779

(22) Filed: Dec. 21, 2004

(65) Prior Publication Data

US 2006/0134944 A1    Jun. 22, 2006

(51) Int. Cl.
 *H01R 13/648*  (2006.01)
(52) U.S. Cl. ..................................... 439/608
(58) Field of Classification Search ............... 439/940, 439/608, 79, 819, 83, 876
See application file for complete search history.

(56) References Cited

U.S. PATENT DOCUMENTS

| | | | | |
|---|---|---|---|---|
| 5,508,628 A | * | 4/1996 | Pfaff | 324/755 |
| 5,586,008 A | | 12/1996 | Kozel et al. | 361/743 |
| 5,688,133 A | * | 11/1997 | Ikesugi et al. | 439/135 |
| 5,731,958 A | | 3/1998 | Kozel | 361/743 |
| 5,827,090 A | | 10/1998 | Knighton | 439/571 |
| 5,833,471 A | | 11/1998 | Selna | 439/73 |
| 5,860,815 A | * | 1/1999 | Feldman et al. | 439/79 |
| 6,049,464 A | * | 4/2000 | Garbelli et al. | 361/760 |
| 6,313,999 B1 | * | 11/2001 | Fratti et al. | 361/774 |
| 6,392,887 B1 | | 5/2002 | Day et al. | 361/704 |
| 6,413,111 B1 | * | 7/2002 | Pickles et al. | 439/342 |
| 6,475,023 B2 | * | 11/2002 | Carneling | 439/488 |
| 6,753,474 B2 | * | 6/2004 | Trout | 174/66 |
| 6,783,369 B2 | | 8/2004 | Zhang | 439/41 |
| 6,805,278 B1 | | 10/2004 | Olson et al. | 228/180.22 |
| 6,976,886 B2 | | 12/2005 | Winings et al. | 439/701 |
| 2004/0097104 A1 | * | 5/2004 | Zhang | 439/41 |
| 2004/0198082 A1 | * | 10/2004 | Zaderej et al. | 439/83 |
| 2006/0121764 A1 | | 6/2006 | Lin et al. | 439/331 |

* cited by examiner

Primary Examiner—Tulsidas C. Patel
Assistant Examiner—Vladimir Imas
(74) Attorney, Agent, or Firm—Woodcock Washburn LLP

(57) ABSTRACT

An electrical assembly that may include a weighted cap. The weighted cap may provide counterbalancing to a non-proportional ball-grid array connector integrated circuit package for connection with a substrate. The weighted cap provides compensation for variations in the imbalance of the electronic connector package against the substrate.

19 Claims, 7 Drawing Sheets

CAP FOR AN ELECTRICAL CONNECTOR

FIELD OF THE INVENTION

The invention relates generally to electrical connectors. More specifically, the invention relates to a cap for an electrical connector that weights the connector to facilitate mounting of the connector on the surface of a substrate.

BACKGROUND OF THE INVENTION

Electrical connectors, such as ball-grid array (BGA) connectors, are usually mounted on the surface of a substrate using multiple solder connections. The solder connections act as electrical and mechanical connections between the substrate and contact pads on the connector.

The weight of some BGA connectors is not distributed evenly across the solder balls (or other fusible elements). For example, the center of gravity of some BGA connectors, such as right angle BGA connectors, may be offset from the geometric center thereof to an extent that causes the connector to tilt (or tip) on the substrate. Such tilting can vary the pressures on the solders ball of the ball-grid array. In other words, the weight of the connector may be distributed unevenly among the solder balls. Such uneven distribution can result in differences in the collapsing properties and the height of the solder balls as the solder balls are melted to form electrical connections. These factors degrade the strength and integrity of the resulting solder connections. In extreme cases, tilting can result in separation of the solder ball from the associated contact pad, thereby inhibiting the formation of an electrical connection.

SUMMARY OF THE INVENTION

A preferred embodiment for a method of mounting an electrical connector to a substrate includes placing an electrical connector onto a substrate so that a fusible element substantially aligns with the contact pad on the substrate, providing a cap for the electrical connector where the cap has a geometric center offset from its center of gravity, placing the cap onto the electrical connector to counterbalance and reposition the center of gravity of the electrical connector so that the weight of the combined assembly is centered over the fusible area, and heating the electrical connector and the substrate to create at least one electrical connection between the electrical connector and the substrate so that the fusible elements form into a common geometry.

A preferred embodiment of a cap for a electrical connector includes a body, where the body includes a substantially planar first surface suitable for vacuum pickup, a second surface formed to engage the electrical connector, and a center of gravity and a geometric center where the center of gravity is offset from the geometric center so that the cap balances the electrical connector on the substrate fusible area when the cap is placed on the electrical connector.

A preferred embodiment of an assembly includes a substrate, where the substrate includes an upper side having at least one contact pad for connection, an electrical connector, where the electrical connector comprises a housing, an electrical conductor mounted within the housing, a fusible element attached to the electrical conductor for forming an electrical connection with the substrate, a center of gravity, and a geometric center, where the center of gravity of the electrical connector is offset from the geometric center of the electrical connector along at least one axis, and a cap for mating with the electrical connector, where the cap comprises a body with a center of gravity and a geometric center, where the center of gravity of the cap is offset from the geometric center of the cap so that the cap relocates the center of gravity of the combined assembly in alignment with the center of the fusible area when the cap is placed on the electrical connector.

A preferred embodiment of a method for mounting a ball-grid array connector to a substrate includes placing the ball-grid array connector onto the substrate so that a fusible element array substantially aligns with an array of contact pads on the substrate, providing a cap for the ball-grid array connector, wherein the cap has a geometric center offset from its center of gravity, placing the cap onto the ball-grid array connector to counterbalance the ball-grid array connector, and heating the ball-grid array connector and the substrate to create at least one electrical connection between the ball-grid array connector and the substrate.

BRIEF DESCRIPTION OF THE DRAWINGS

The foregoing summary, as well as the following detailed description of a preferred embodiment, are better understood when read in conjunction with the appended diagrammatic drawings. For the purpose of illustrating the invention, the drawings show an embodiment that is presently preferred. The invention is not limited, however, to the specific instrumentalities disclosed in the drawings. In the drawings.

DETAILED DESCRIPTION OF ILLUSTRATIVE EMBODIMENTS

The figures depict a preferred embodiment of a cap 200 for use with a right-angle ball-grid array (BGA) connector 20. The cap 200 is described in conjunction with this particular type of connector for exemplary purposes only; alternative embodiments of the cap 200 can be configured for use with virtually any type of surface-mounted connector. The figures are each referenced to a common coordinate system 11 depicted therein.

The connector 100 is shown as being mounted on a printed circuit board (PCB) 100. The use of this particular type of substrate is depicted for exemplary purposes only. The connector 20 can be mounted on other types of substrates, such as printed wire boards, backplanes, etc.

Figure 2:
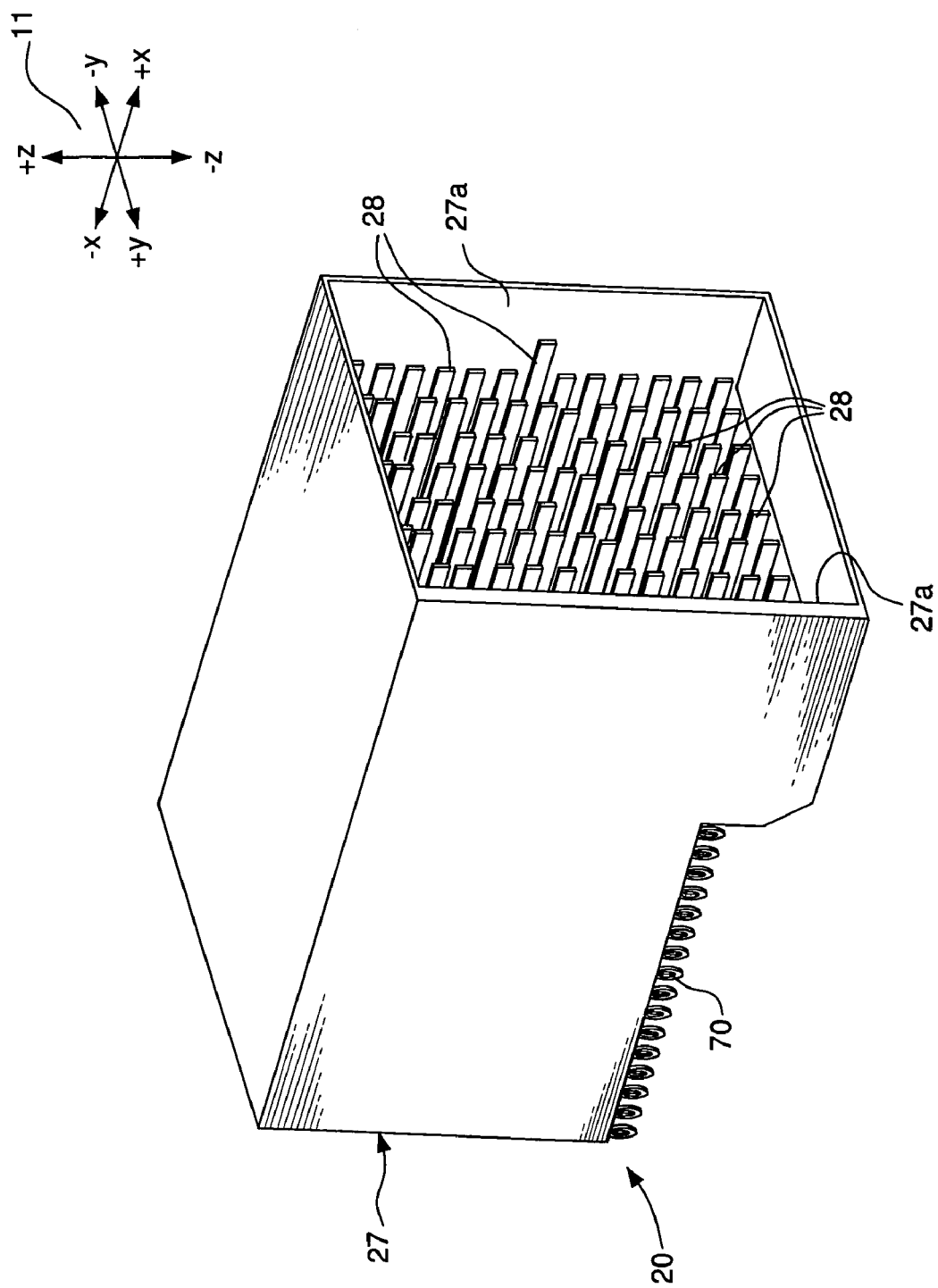
FIG. 2 is a perspective view of a right angle ball-grid array connector.
Figure 3:
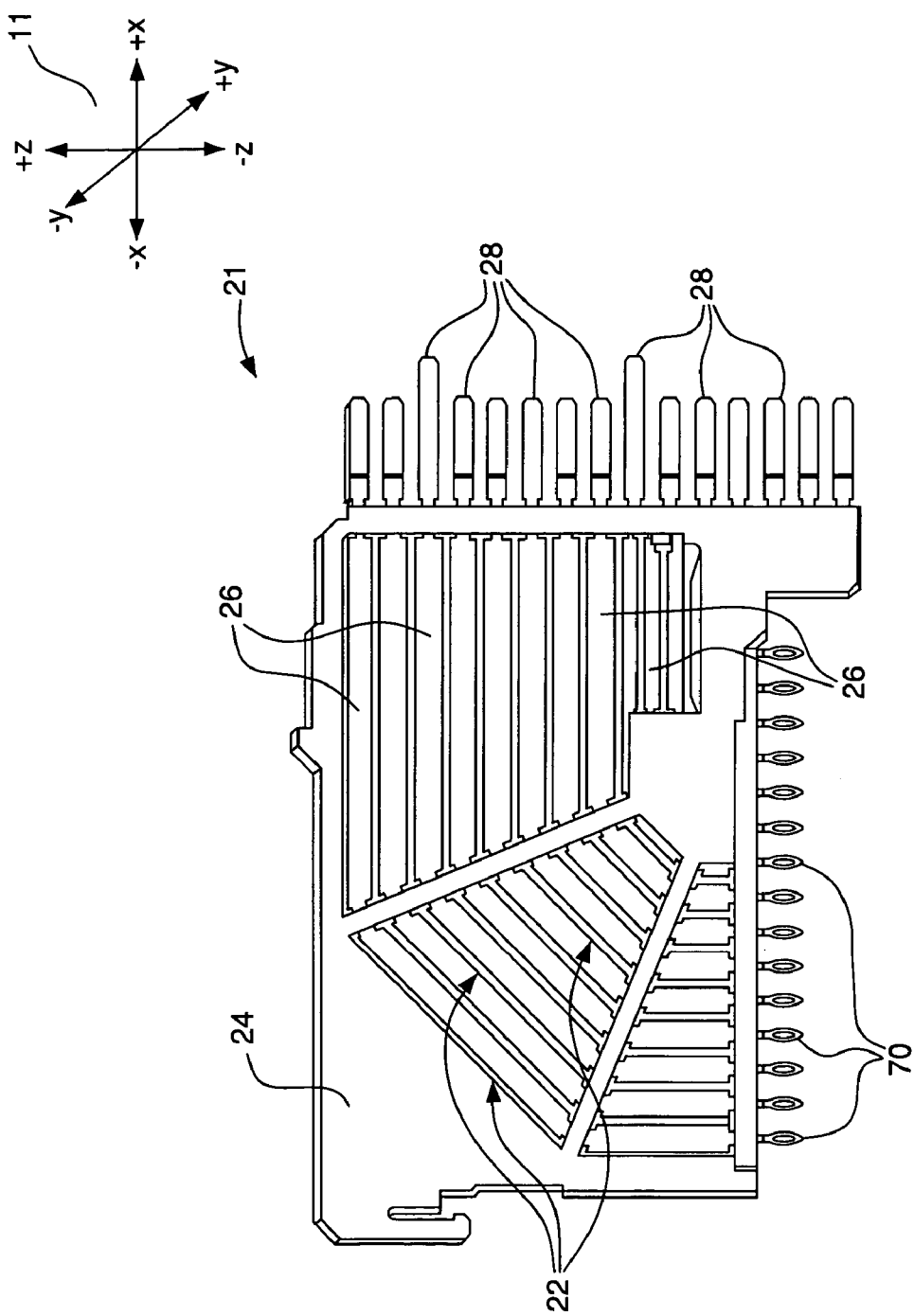
FIG. 3 is an exemplary view of an insert molded leadframe assembly of the ball-grid array connector shown in FIG. 2.

The connector 20 comprises an electrically-insulative housing 27, and a plurality of insert molded leadframe assemblies (IMLAs) 21 positioned within the housing 27 (see FIGS. 2 and 3). Each IMLA 21 includes a plurality of electrical conductors 22 that extend through an overmolded frame 24. The frame 24 is formed from a suitable electrically-insulative material such as plastic. Each electrical conductor 22 preferably includes a lead portion 26, a pin (not shown) adjoining a first end of the lead portion 26, and a blade contact 28 adjoining a second end of the lead portion 26. Each IMLA 21 can include fifteen of the electrical conductors 22.

The electrical conductors 22 vary in length. The electrical conductors 22 are arranged side-by-side within the housing 27, so that the blade contacts 28 form a vertically-oriented column adjacent to the front edge of the frame 24, and the pins form a horizontally-oriented row along the bottom of the frame 24 (from the perspective of FIGS. 2 and 3).

Figure 4:
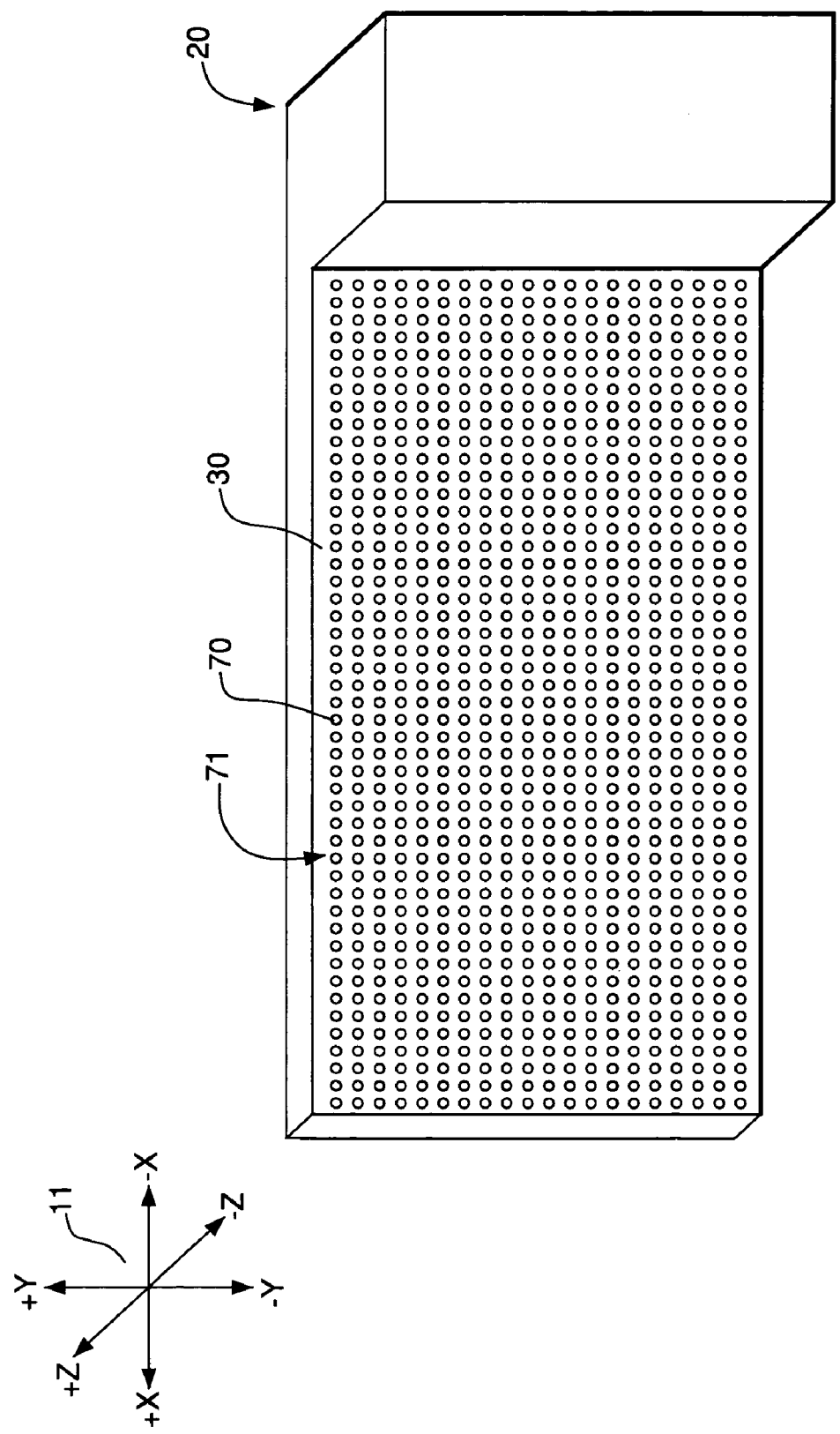
FIG. 4 is an exemplary view of the lower surface of a ball-grid array connector shown in FIG. 2.

A fusible element is attached to each pin of the electrical conductors 22. The fusible element can be, for example, a solder ball 70. The solder balls 70 form a ball-grid array 71 on the bottom of the connector 20, as depicted in FIG. 4. The solder balls 70 each contact an associated contact pad 120 on the PCB 100 which defines the fusible area 122 when the connector 20 is mounted thereon, as discussed below.

The electrical connector 20 has a mid-point (geometric center) 50, and a center of gravity 60. The electrical connector 20 is not symmetric about the geometric center 50, when viewed from the perspective of FIGS. 1 and 6A. In other words, the connector 20 is not symmetrically disposed about an axis extending in the "y" direction and passing through the geometric center 50. The center of gravity 60 therefore is offset from the geometric center 50 from the perspective of FIGS. 1 and 6A.

It should be noted that the geometric center 50 and the center of gravity 60 are depicted diagrammatically; the geometric center 50 and the center of gravity 60 are not necessarily located at the positions depicted in the figures. Moreover, the above details of the connector 20 are presented for exemplary purposes only. The principles of the present invention can be applied to virtually any type of surface-mount connector.

The connector 20 is placed on the PCB 100 so that the solder balls 70 each substantially align with a corresponding contact pad 120 on the PCB 100, as noted above. The solder balls 70 are subsequently heated by a suitable process such as a reflow operation. The heating melts the solder balls 70. The solder, upon cooling, forms electrical connections between the pins of the electrical conductors 22 and the associated contact pads 120.

Figure 1:
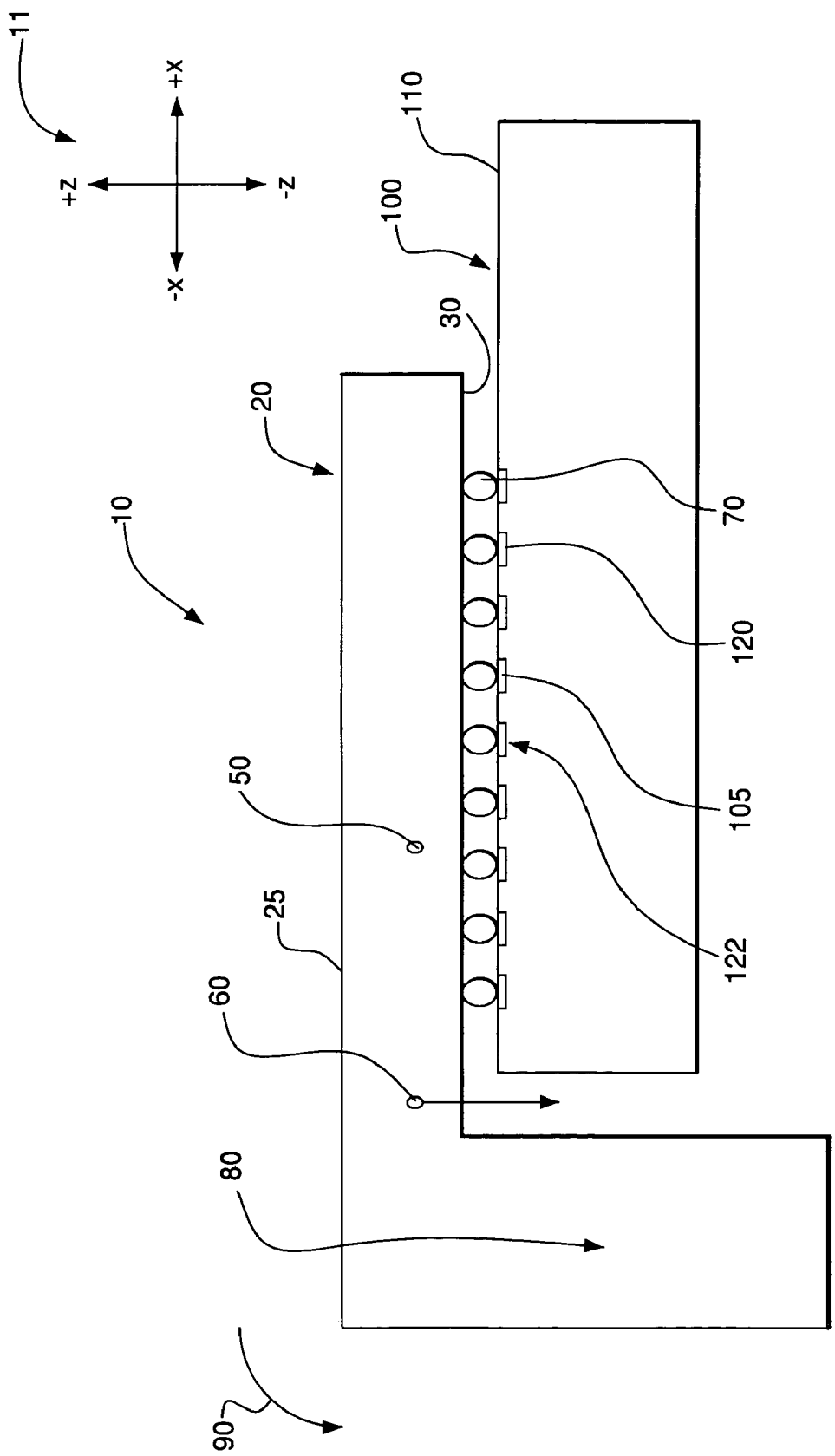
FIG. 1 is an exemplary view of a substrate and an electrical connector showing a fusible area.
Figure 5:
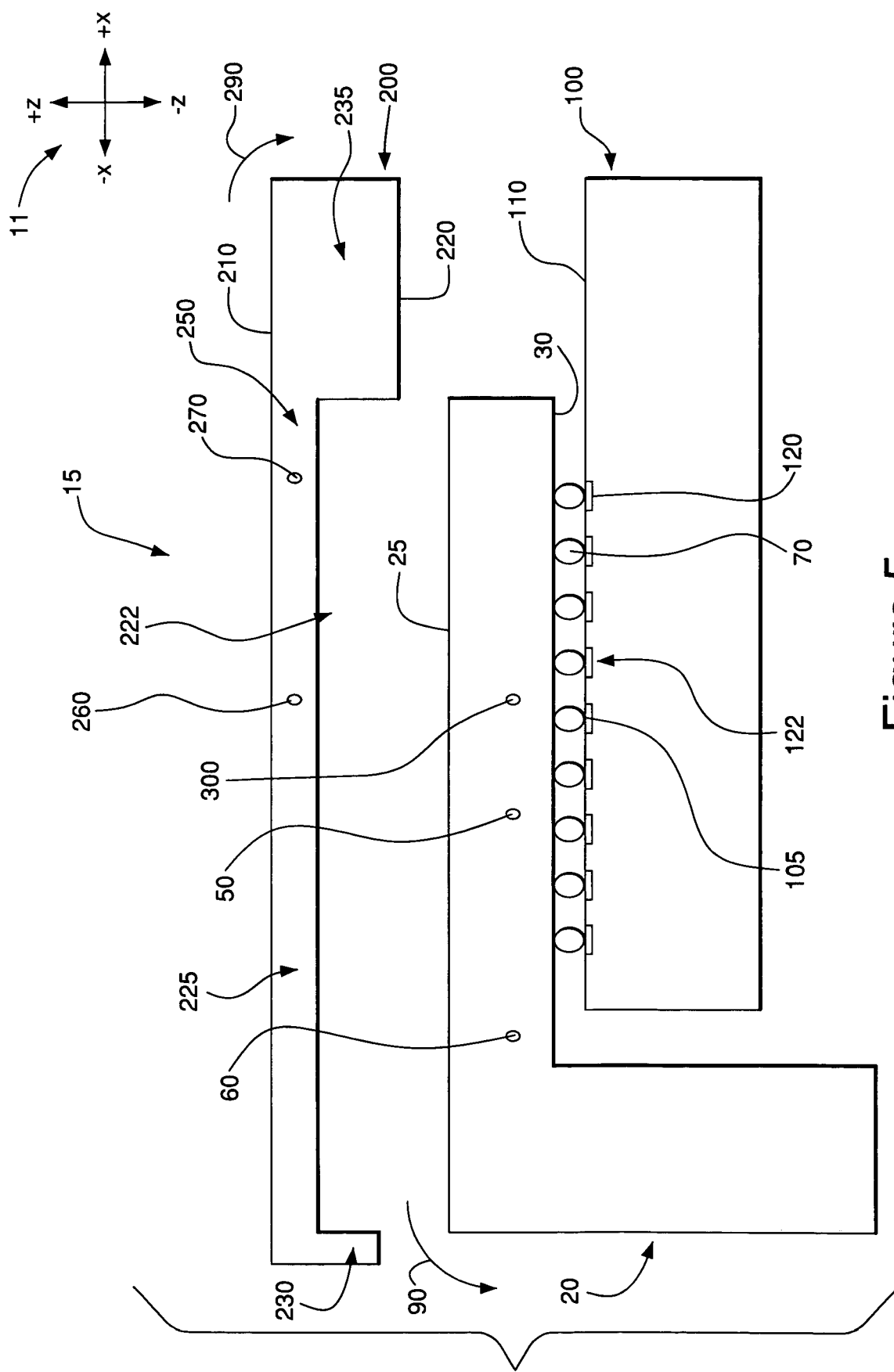
FIG. 5 is an exemplary exploded view of an electrical assembly including a substrate, an electrical connector, and a cap in a preferred embodiment of this invention.
Figure 6A:
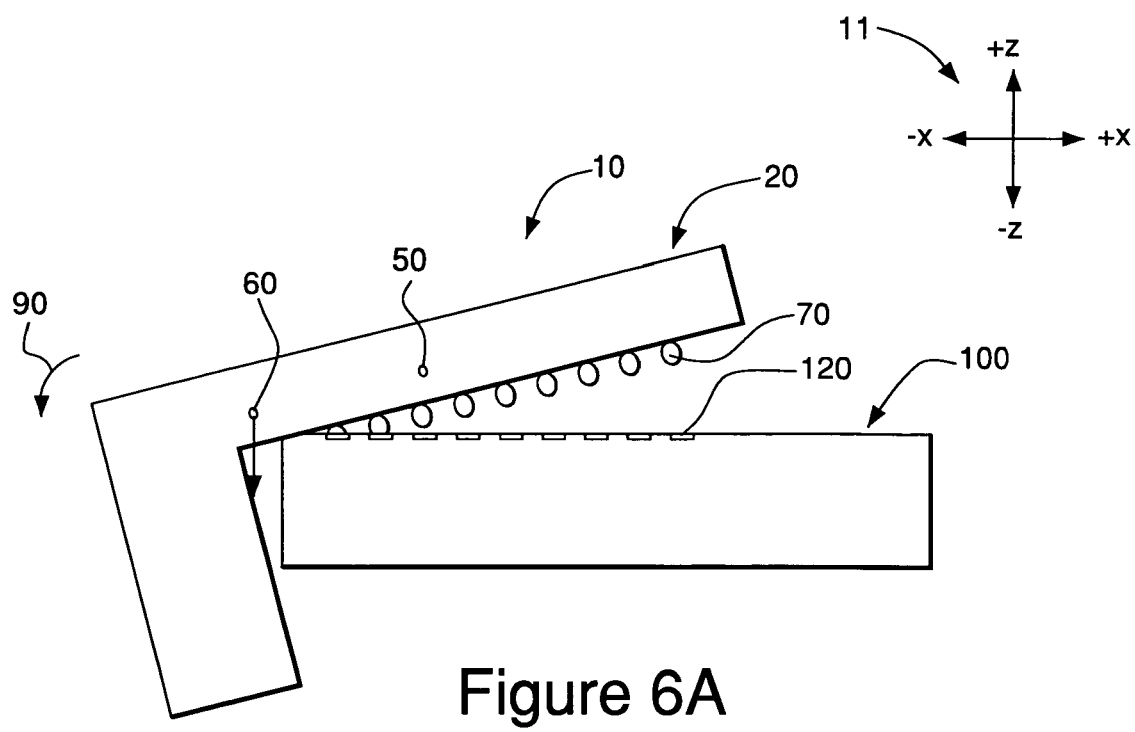
FIG. 6A is an exemplary view of a substrate and electrical connector.

The above-noted offset in the center of gravity 60 of the connector 20 causes the center of gravity 60 to overhang the ball-grid array 71, as shown in FIGS. 1, 5 and 6A. The weight of the connector 20 (acting through the center of gravity 60), in combination with the reactive force exerted by the PCB 100 on the connector 20 by way of the solder balls 70, generate a counterclockwise moment on the connector 20 (from the perspective of FIGS. 1, 5, and 6A). This moment is denoted by the arrow 90 in FIGS. 1, 5, and 6A. The moment 90, if not counteracted, can cause the connector 20 to tilt, as shown in FIG. 6A, thereby causing at least some of the solder balls 70 to lose contact with their corresponding contact pads 120 or to not have a common geometry.

The cap 200 can act as a counterweight that counteracts the moment 90, thereby preventing the above-noted tilting of the connector 20. The cap 200 comprises a solid body 250 having a first surface 210 and a second surface 220. The first surface 210 preferably is planar, to facilitate pick-up of the cap 200 by a vacuum pickup.

The second surface 220 is configured to engage the electrical connector 20. In particular, the second surface 220 defines a cavity 222. The shape of the cavity 222 is substantially similar to that of the uppermost portion of the connector 20, so that the cap 200 fits snugly over the connector 20, i.e., the cap 200 fits over the connector 20 with minimal clearance therebetween.

The body 250 is configured so that the cap 200 acts as a counterweight to substantially balance the connector 20 when the connector 20 is placed on the PCB 100. This is achieved by configuring the body 250 to be non-symmetric about the mid-point (geometric center) thereof, from the perspective of FIG. 5. (The geometric center of the body 250 is denoted in the figures by the reference numeral 260.) In other words, the body 250 is non-symmetric about an axis extending the in "y" direction and passing through the geometric center 260. In particular, the body 250 is configured with a receiving portion 225, a first side portion 230 located to one side of the receiving portion 225 (from the perspective of FIG. 5), and a second side portion 235 located to the other side of the receiving portion 225.

The second side portion 235 is substantially larger than the first side portion 230, as shown in FIG. 5. The weight of the second side portion 235 therefore is substantially greater than that of the first side portion 230. This feature causes the weight of the body 250 to be distributed asymmetrically about the geometric center 260 (from the perspective of FIG. 5). The center of gravity of the body 250 therefore is offset from the geometric center 260. (The center of gravity of the body 250 is denoted in the figures by the reference numeral 270.) In other words, the center of gravity 270 and the geometric center 260 are located at a different positions along the "x" axis denoted in the figures.

Figure 7A:
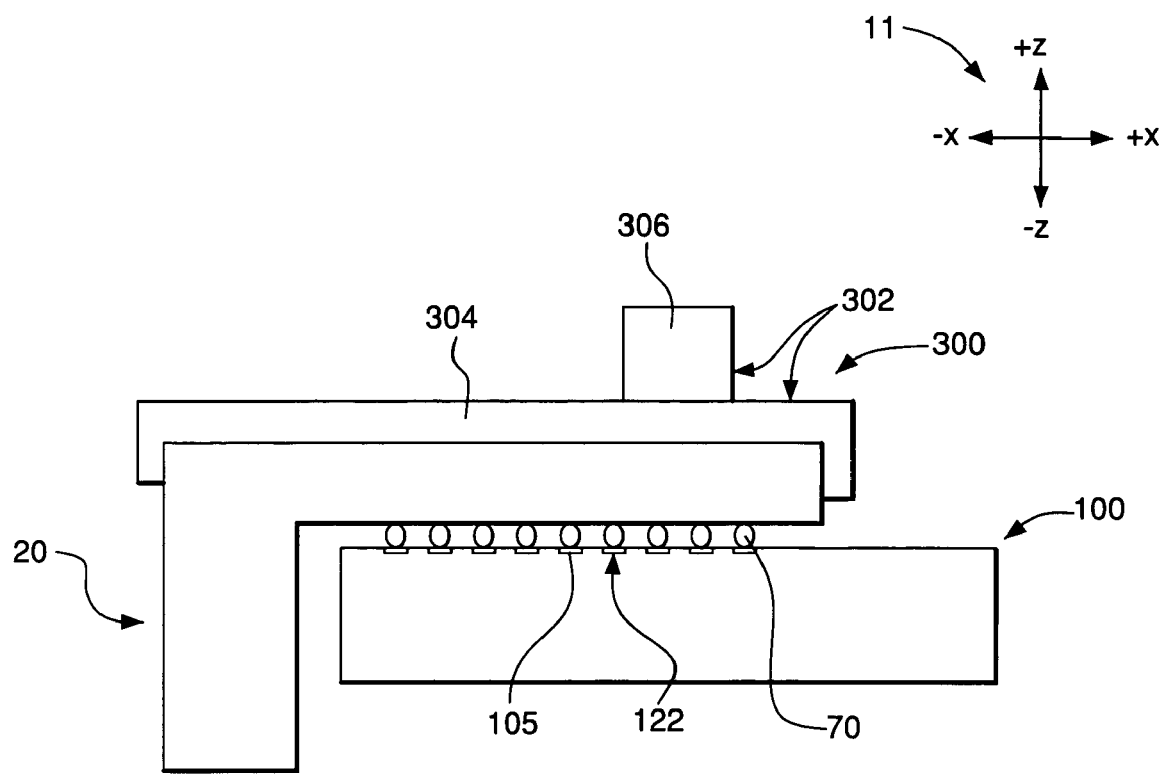
FIG. 7A is a side view of an alternative embodiment of the cap shown in FIGS. 5 and 6B, with a balancing portion of the cap in a first position on a cap portion of the cap.
Figure 7B:
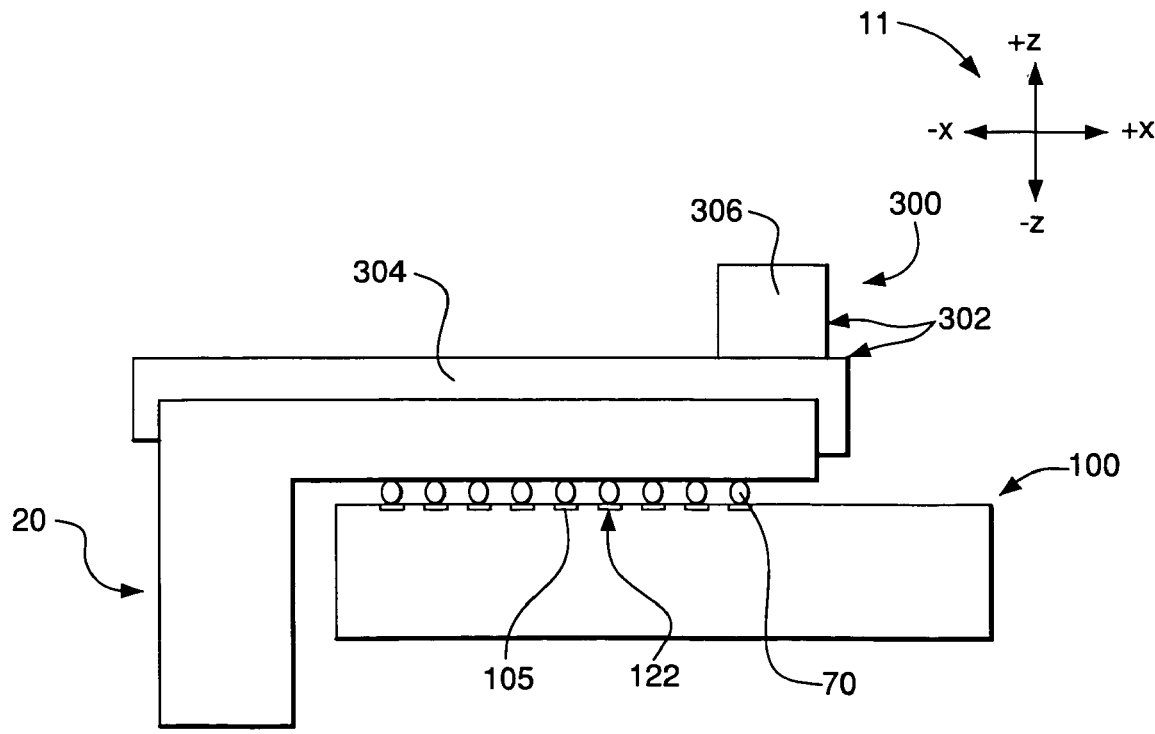
FIG. 7B is a side view of the cap shown in FIG. 6A, with the balancing portion of the cap in a second position on the cap portion.

Alternative embodiments of the cap 200, such as a cap 300 depicted in FIGS. 7A and 7B, can comprise a body 302 having two separate portions, a cap portion 304 and a balancing portion 306, in contradistinction of the one-piece, homogenous cap 200. The balancing portion 306 can be selectively positioned on the cap portion 304 so that the combined cap portion 304 and balancing portion 306 perform the same balancing function as the cap 200.

Further, it should be noted that the geometric center 260 and the center of gravity 270 are depicted diagrammatically; the geometric center 260 and the center of gravity 270 are not necessarily located at the positions depicted in the figures.

Figure 6B:
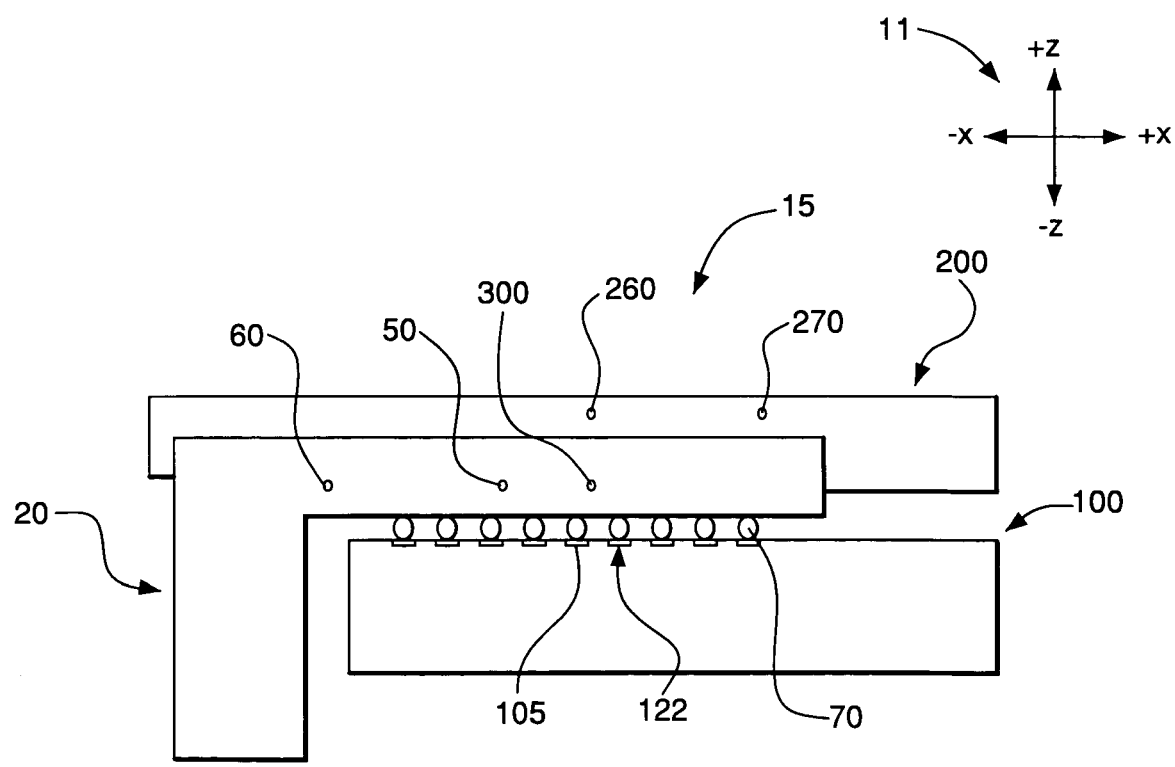
FIG. 6B is an exemplary view of a substrate, an electrical connector, and a cap.

The cap 200 preferably is constructed so that the cap 200 counterbalances the connector 20 when the connector 20 is placed on the PCB 100, as noted above. More specifically, the second side portion 235 of the cap 200 is sized so that the cap 200 generates a clockwise moment on the connector 20 when the cap 200 is placed thereon (this moment is denoted by the arrow 290 in FIG. 5). The moment 290 offsets the moment 90 acting on the connector 20, and thereby can reduce or eliminate the tendency of the connector 20 to tip as shown in FIG. 6A. In other words, it is believed that the combined center of gravity of the connector 20 and the cap 200 is located over the ball-grid array 71, more specifically over the center of the fusible area 105, so that the reactive force exerted by the solder balls 70 in response to the weight of the connector 20 and the cap 200 does not cause the connector 20 to tip. The use of the cap 200 thereby can help to align and maintain contact between each solder ball 70 and its associated contact pad 120 when the connector 20 is placed on the PCB 100 during installation. (The combined center of gravity of the connector 10 and the cap 200 is denoted by the reference numeral 300 in FIGS. 5 and 6B).

The cap 200 can be positioned on the connector 20 before or after the cap 200 is placed on the substrate 100. For example, in one preferred mounting process, the cap 200 is positioned on the connector 20 before the connector 20 is placed on the substrate 100. The combined cap 200 and connector 20 are lifted and placed on the substrate using an automated device that engages the first surface 210 of the body 250 by way of a vacuum pickup. The connector 20 can be subject to a reflow process that melts the solder balls 70 and forms electrical connections between the connector 20 and the substrate 100, as discussed above. The cap 200 can be removed after the solder has cooled to form the electrical connections.

The foregoing description is provided for the purpose of explanation and is not to be construed as limiting the invention. While the invention has been described with reference to preferred embodiments or preferred methods, it is understood that the words which have been used herein are words of description and illustration, rather than words of limitation. Furthermore, although the invention has been described herein with reference to particular structure, methods, and embodiments, the invention is not intended to be first to the particulars disclosed herein, as the invention extends to all structures, methods and uses that are within the scope of the appended claims. Those skilled in the relevant art, having the benefit of the teachings of this specification, may effect numerous modifications to the invention as described herein, and changes may be made without departing from the scope and spirit of the invention as defined by the appended claims.

For example, the particular configuration of the cap 200 described herein is tailored to the connector 200. The geometry and relative dimensions of the cap 200 can vary with the type of connector used. Moreover, alternative embodiments of the cap 200 can be formed integrally with the connector with which the cap is used. In other words, alternative embodiments of the cap 200 can be configured to remain on the connector after the connector is installed on its associated substrate.

What is claimed:

1. A system, comprising:
  a cap for a right-angle ball-grid array electrical connector, comprising a body, said body comprising: a substantially planar first surface suitable for vacuum pickup; a second surface formed to engage the electrical connector and defining a recess that receives the electrical connector; first and second portions positioned on opposite sides of the recess; a third portion that includes the second surface; and a center of gravity and a geometric center, wherein the first and second portions are thicker than the third portion, and the first portion weighs more than the second portion so that the center of gravity is offset from the geometric center and the cap balances the electrical connector on a substrate when the cap is placed on the electrical connector; and
  the electrical connector.
2. The cap of claim 1, wherein the electrical connector is a ball-grid array connector.
3. The cap of claim 1, wherein the substrate comprises a printed circuit board.
4. The cap of claim 1, wherein the cap is integral to the electrical connector.
5. The cap of claim 1, wherein the cap is separable from the electrical connector.
6. The cap of claim 1, wherein said second surface comprises a receiving portion, a first side portion, and a second side portion.
7. The cap of claim 1, wherein the first and second portions overhang exterior edges of the electrical connector when the cap is placed on the electrical connector.
8. The cap of claim 1, wherein the cap exerts a moment on the electrical connector and the moment counteracts another moment acting on the electrical connector due to the weight of the electrical connector whereby the cap balances the electrical connector on the substrate when the cap is placed on the electrical connector.
9. The cap of claim 1, wherein the recess receives a substantial entirety of a length of the electrical connector.
10. The cap of claim 9, wherein the recess receives a substantial entirety of a width of the electrical connector.
11. A system, comprising:
  a cap for balancing a right-angle ball-grid array electrical connector, the cap comprising a body capable of being mounted on the electrical connector, wherein the body has a first and a second side portion, and a substantially flat surface suitable for vacuum pickup, the body has a length greater than a length of the electrical connector, the body is non-symmetrically disposed about a geometric center of the body in a lengthwise direction of the body, the first side portion of the body has a first height so that the first side portion overhangs one side of the connector by a first distance, and the second side portion of the body has a second height greater than the first height so that the second side portion overhangs another side of the electrical connector by a second distance greater than the first distance when the body is mounted on the electrical connector, whereby the body exerts a moment on the electrical connector, and the first side portion faces the second side portion so that the first and second side portions define a continuous recess that receives a portion of the electrical connector; and
  the electrical connector.
12. The cap of claim 11, wherein the second side portion is separable from the first side portion, and the position of the second side portion relative to the first side portion can be adjusted so that the cap balances the electrical connector on a substrate when the cap is placed on the electrical connector.
13. The cap of claim 11, wherein the second side portion of the body is heavier than the first side portion of the body.
14. The cap of claim 11, wherein the moment counterbalances another moment resulting from the weight of the electrical connector so that the electrical connector does not tip when the electrical connector is placed on a substrate and the cap is placed on the electrical connector.
15. A system, comprising:
  a cap for balancing a right-angle ball-grid array electrical connector, the cap comprising a body capable of being mounted on the electrical connector, wherein the body has a substantially flat surface suitable for vacuum pickup, the body has a recess formed therein that extends continuously across an entire width of the body and receives substantially an entire length of the electrical connector, and a center of gravity of the cap is offset from a geometric center of the cap so that a combined center of gravity of the cap and the connector is located at a different position along a length of the electrical connector than a center of gravity of the electrical connector; and the electrical connector.

16. The cap of claim 15, wherein the body includes a first portion disposed on one side of the recess, and a second portion disposed on another side of the recess, and the first portion weighs more than the second portion.

17. The cap of claim 16, wherein the first and second portions overhang exterior edges of the electrical connector when the cap is mounted on the electrical connector.

18. The cap of claim 16, wherein the weight of the first portion generates a moment that counteracts a moment generated by the weight of the electrical connector when the electrical connector is placed on a substrate and the cap is mounted on the electrical connector.

19. The cap of claim 15, wherein the recess receives substantially an entire width of the electrical connector.

* * * * *